United States Patent
Zhao

(10) Patent No.: US 9,147,749 B2
(45) Date of Patent: Sep. 29, 2015

(54) TRANSISTORS AND FABRICATION METHOD THEREOF

(71) Applicant: Semiconductor Manufacturing International (Shanghai) Corporation, Shanghai (CN)

(72) Inventor: Neil Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 77 days.

(21) Appl. No.: 14/022,500

(22) Filed: Sep. 10, 2013

(65) Prior Publication Data

US 2014/0319625 A1     Oct. 30, 2014

(30) Foreign Application Priority Data

Apr. 28, 2013 (CN) .......................... 2013 1 0157798

(51) Int. Cl.
*H01L 21/336* (2006.01)
*H01L 29/66* (2006.01)
*H01L 29/78* (2006.01)
*H01L 29/06* (2006.01)
*H01L 29/10* (2006.01)

(52) U.S. Cl.
CPC ........ *H01L 29/6656* (2013.01); *H01L 29/0649* (2013.01); *H01L 29/0653* (2013.01); *H01L 29/1054* (2013.01); *H01L 29/66651* (2013.01); *H01L 29/78* (2013.01); *H01L 29/66545* (2013.01); *H01L 29/66553* (2013.01)

(58) Field of Classification Search
CPC .................... H01L 29/66621; H01L 29/6656; H01L 29/78
USPC .......................................... 438/289, 290, 151
See application file for complete search history.

(56) References Cited

U.S. PATENT DOCUMENTS

2014/0027853 A1* 1/2014 Asenov .......................... 257/348

* cited by examiner

Primary Examiner — Thien F Tran
(74) Attorney, Agent, or Firm — Anova Law Group, PLLC

(57) ABSTRACT

A method is provided for fabricating a transistor. The method includes providing a semiconductor substrate; and forming a trench in the semiconductor substrate by etching the semiconductor substrate. The methods also includes forming a threshold-adjusting layer doped with a certain type of threshold-adjusting ions to adjust the threshold voltage of the transistor on the semiconductor substrate in the trench; and forming a carrier drifting layer on the threshold-adjusting layer. Further the method includes forming a gate structure on the carrier drifting layer corresponding to the trench.

19 Claims, 8 Drawing Sheets

TRANSISTORS AND FABRICATION METHOD THEREOF

CROSS-REFERENCES TO RELATED APPLICATIONS

This application claims the priority of Chinese patent application No. 201310157798.6, filed on Apr. 28, 2013, the entirety of which is incorporated herein by reference.

FIELD OF THE INVENTION

The present invention generally relates to the field of semiconductor manufacturing technology and, more particularly, relates to transistors and fabrication techniques thereof.

BACKGROUND

In semiconductor processing technology, the threshold voltage of a transistor may be equal to a required bias voltage between a source region and a drain region to form a channel region. If the bias voltage between the source region and the drain region is smaller than the threshold voltage, the channel region may be unable to be formed.

The bottom portion of a gate structure of the transistor may be doped to adjust the threshold voltage, and the doping level may be a major factor for determining the threshold voltage. The doping of the bottom of the gate structure may be adjusted by an ion implantation process. The ion implantation process may be referred as a threshold-adjusting ion implantation process.

A conventional threshold-adjusting ion implantation process may be performed by doping a portion of the semiconductor substrate under the gate structure with certain type of threshold-adjusting ions to form a doping region, and a threshold voltage adjustment of the transistor may be achieved. However, the carrier mobility of the semiconductor substrate may be reduced after the threshold-adjusting ion implantation process. Compared with an intrinsic semiconductor, the scattering possibility of the carriers in the semiconductor doped by the threshold ion implantation process may be increased, thus the carrier mobility may be reduced. A higher doping concentration may result in a lower carrier mobility. The power consumption of a transistor may be increased if the carrier mobility is reduced, and a current withstand capability and a switching speed of the transistor may also be reduced.

Therefore, it may need to increase the carrier mobility of an existing transistor to improve the short channel effect while the threshold voltage is adjusted. The disclosed device structures and methods may overcome one or more problems set forth above by forming a threshold-adjusting layer.

BRIEF SUMMARY OF THE DISCLOSURE

One aspect of the present disclosure includes a method for fabricating a transistor. The method includes providing a semiconductor substrate; and forming a trench in the semiconductor substrate by etching the semiconductor substrate. The methods also includes forming a threshold-adjusting layer doped with a certain type of threshold-adjusting ions to adjust the threshold voltage of the transistor on the semiconductor substrate in the trench; and forming a carrier drifting layer on the threshold-adjusting layer. Further, the method includes forming a gate structure on the carrier drifting layer corresponding to the trench.

Another aspect of the present disclosure includes a transistor. The transistor includes a semiconductor substrate; and a threshold-adjusting layer doped with a certain type of threshold-adjusting ions to adjust the threshold voltage of the transistor in the semiconductor substrate. The transistor also includes a carrier drifting layer on the threshold-adjusting layer; and a gate structure on the carrier drifting layer. Further, the transistor includes a source region and a drain region in the semiconductor substrate at both sides of the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 18:
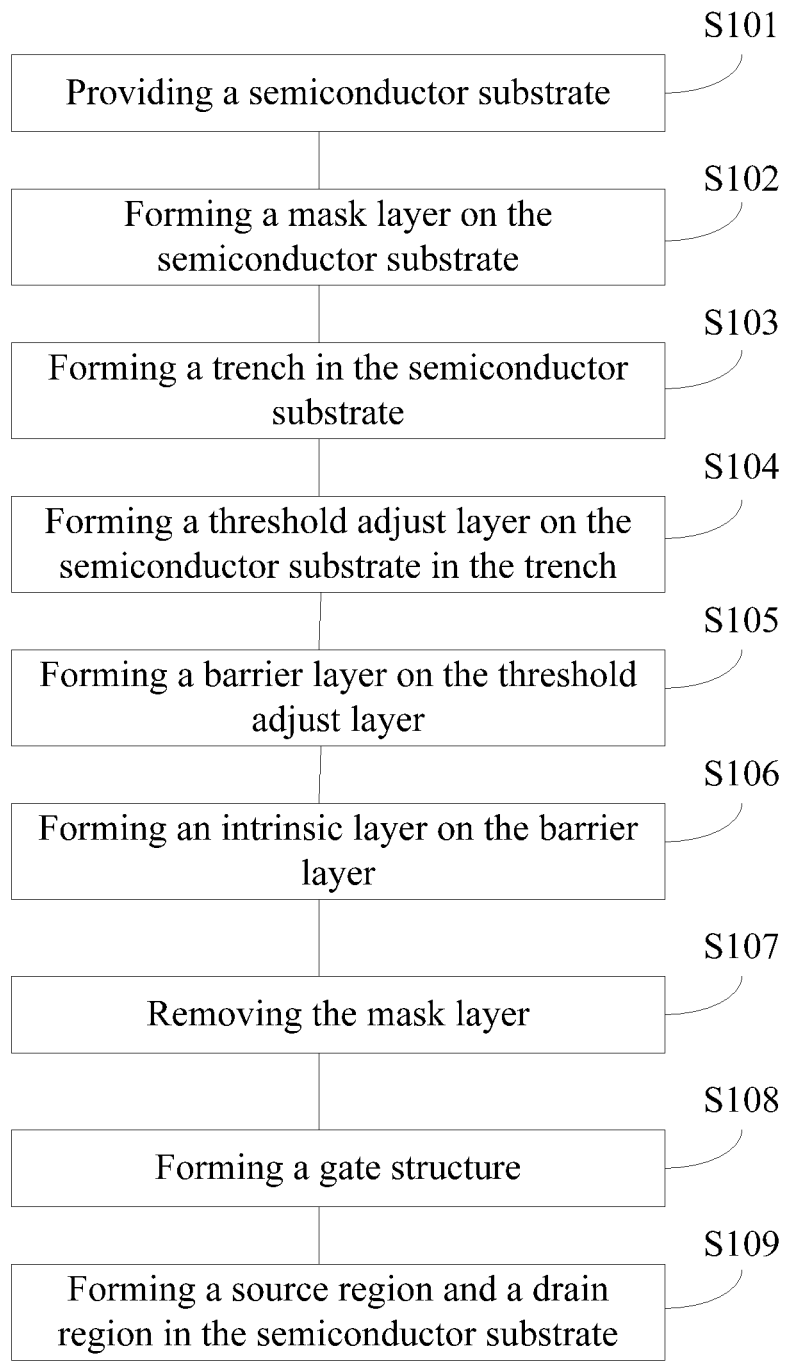
FIG. 18 illustrates another exemplary fabrication process of a semiconductor structure consistent with the disclosed embodiments.

FIG. 18 illustrates an exemplary fabrication process of a transistor, and FIGS. 1-9 illustrate exemplary semiconductor structures corresponding to various stages of the fabrication process.

Figure 1:
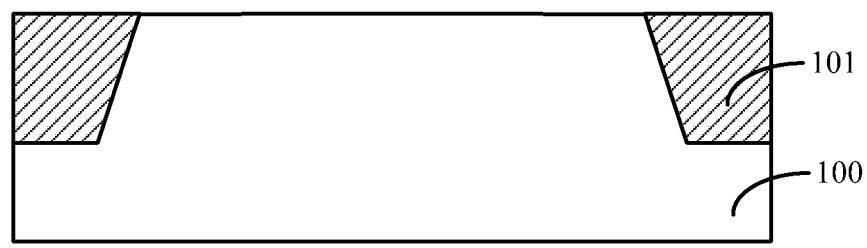
FIGS. 1-9 illustrate semiconductor structures corresponding to certain stages of an exemplary fabrication process of a transistor consistent with the disclosed embodiments.

As shown in FIG. 18, at the beginning of the fabrication process, a semiconductor substrate with certain structures is provided (S101). FIG. 1 illustrates a corresponding semiconductor structure.

As shown in FIG. 1, a semiconductor substrate 100 is provided. The semiconductor substrate 100 may have a plurality of shallow trench isolation (STI) structures 101.

The semiconductor substrate 100 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or alloy semiconductor, etc. In one embodiment, the semiconductor substrate 100 is silicon. The substrate 100 provides a base for subsequent processes and structures.

The STI structures 101 may be formed in one surface of the semiconductor substrate 100. Transistors may be subsequently formed in regions isolated by the STI structures 101. The STI structures 101 may be formed by sequentially etching the surface of the semiconductor substrate 100 to form trenches with a certain depth; filling the trenches with appropriate insulating material to form isolation structures; and polishing the isolation structures to level with the surface of the semiconductor substrate 100.

Figure 2:
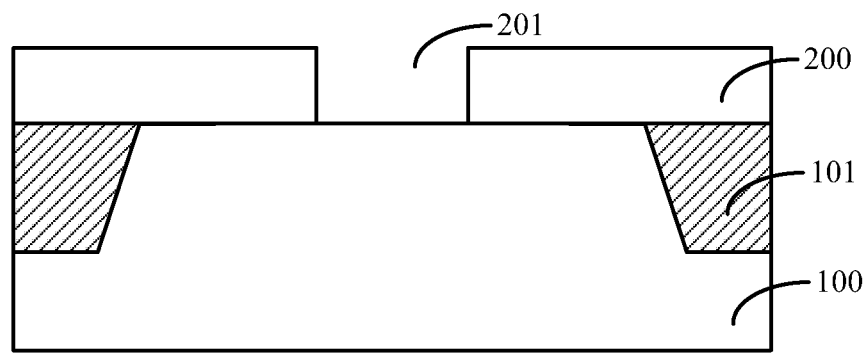

Returning to FIG. 18, after providing the semiconductor substrate 100 with the STI structures 101, a mask layer may be formed on the semiconductor substrate 100 (S102). FIG. 2 illustrates a corresponding semiconductor structure.

As shown in FIG. 2, a mask layer 200 is formed on the surface of the semiconductor substrate 100. The mask layer 200 may have an opening 201. The mask layer 200 may be made of one or more of SiN, TiN, TaN, SiCN, SiC, SiON, BN, and amorphous carbon, etc. In one embodiment, the mask layer 200 is made of SiN.

In certain other embodiments, the mask layer 200 may be a stacked structure. For example, the mask layer 200 may include a buffer layer on the surface of the semiconductor substrate 200 and a hard mask layer on the buffer layer. The buffer layer may be made of SiO, SiN, or SiON, etc. The hard mask layer may be made of one or more of SiN, TiN, TaN, SiCN, SiC, SiON, BN, and amorphous carbon, etc. The buffer layer may be used to release a stress between the surface of the semiconductor substrate 100 and the hard mask layer, the side surfaces of the opening 201 may have a better morphology.

The mask layer 200 may be formed by a chemical vapor (CVD) process, a physical vapor deposition (PVD) process, an epitaxial growth process, or an atomic layer deposition (ALD) process, etc. The opening 201 may be formed by an etching process, or a shadow mask method, etc.

Figure 3:
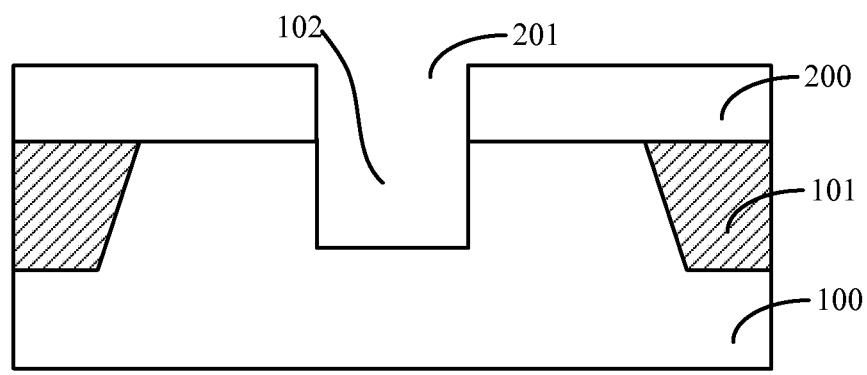

Returning to FIG. 18, after forming the mask layer 200, a trench may be formed in the semiconductor substrate 100 (S103). FIG. 3 illustrates a corresponding semiconductor structure.

As shown in FIG. 3, a trench 102 is formed in the semiconductor substrate 100. The trench 102 may be formed by etching the semiconductor substrate 100 using the mask layer 200 with the opening 201 as an etching mask. A process for etching the semiconductor substrate 100 may be a dry etching process, or a wet etching process, etc.

In one embodiment, a dry etching process is used to etch the semiconductor substrate 100 to form the trench 102. Specifically, the dry etching process may be used to etch the semiconductor substrate 100 along the opening 201. A depth of the trench 102 may be in a range of approximately 23 nm~90 nm. The depth of the trench 102 may be equal to a total depth of subsequently formed a threshold-adjusting layer and a carrier diffusion layer.

In one embodiment, $Cl_2$ and HBr may be used as etching gases of the dry etching process. Other appropriate gas may also be used. A flow of $Cl_2$ may be in a range of approximately 100 sccm~200 sccm. A flow of HBr may be in a range of approximately 50 sccm~300 sccm.

Figure 4:
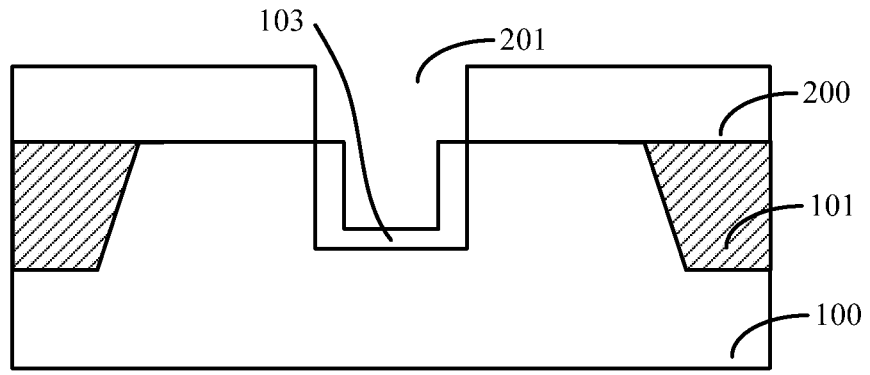

Returning to FIG. 18, after forming the trench 102, a threshold-adjusting layer may be formed (S104). FIG. 4 illustrates a corresponding semiconductor structure.

As shown in FIG. 4, a threshold-adjusting layer 103 is formed in the trench 102. The threshold-adjusting layer 103 may cover the side surfaces of the trench 102. The threshold-adjusting layer 103 may be made of a material same as the semiconductor substrate 100. The threshold-adjusting layer 103 may also be made of a material different from the semiconductor substrate 100. Further, the threshold-adjusting layer 103 may be doped with a certain type of threshold-adjusting ions. In one embodiment, the threshold-adjusting layer 103 is made of silicon doped with a certain type of threshold-adjusting ions.

The threshold-adjusting ions used to dope the threshold-adjusting layer 103 may be used to adjust the threshold voltage of a transistor. For an NMOS transistor, P-type ions may be used as the threshold-adjusting ions to increase the threshold voltage, and N-type ions may be used as the threshold-adjusting ions to decrease the threshold voltage. For a PMON transistor, N-type ions may be used as the threshold-adjusting ions to increase the threshold voltage, and P-type ions may be used as the threshold-adjusting ions to decrease the threshold voltage. The P-type ions may include triels, such as boron, or indium, etc. The N-type ions may include pentels, such as phosphors, or arsenic, etc. A doping concentration of the threshold-adjusting ions in the threshold-adjusting layer 103 may be in a range of approximately $5E17$ atoms/cm$^3$~$1E19$ atoms/cm$^3$.

Various methods may be used to form the threshold-adjusting layer 103, such as a CVD process, a PVD process, an epitaxial growth process, or an ALD process, etc. In one embodiment, the threshold-adjusting layer 103 is formed by an epitaxial growth process, and the threshold-adjusting layer 103 is in situ doped. A temperature of the epitaxial growth process may be in a range of approximately 600° C.~800°. If the threshold-adjusting layer 103 is silicon, a silicon source for epitaxially growing the silicon layer may be $SiH_4$, $SiH_2Cl_2$, or $SiHCl_3$, etc. A threshold-adjusting ion source may be $BF_3$, $PH_3$, or $AsH_3$, etc.

In certain other embodiments, a silicon layer may be formed to cover the inner surface of the trench 102 firstly, the threshold-adjusting ions may be implanted into the silicon layer, and the threshold-adjusting layer 103 may be formed. The threshold-adjusting layer 103 may cover both the bottom and the side surfaces of the trench 102, and an ion implantation process may have certain directivity, the implanted threshold-adjusting ions may have an un-uniform distribution in the threshold-adjusting layer 103 after implanting the threshold-adjusting ions into the silicon layer. The threshold-adjusting ions may mainly be distributed in the threshold-adjusting layer 103 on the bottom of the trench 102, thus an threshold-adjusting effect of the transistor may be realized.

In certain other embodiments, the threshold-adjusting layer 103 may also have one or more type of diffusion barrier ions including Ge ions, C ions, or Sn ions, etc. The diffusion barrier ions may be doped into the threshold-adjusting layer 103 by an ion implantation process. The ion implantation process for doping the diffusion barrier ions may be performed before and/or after the ion plantation process for performing the threshold-adjusting ion implantation process.

A process for doping the diffusion barrier ions may also be an in situ process. That is, a gas containing one or more of Ge, C, or Sn, etc., may be added when the silicon layer is formed by an epitaxial growth process. The in situ ion implantation process for the diffusion barrier ions may also be performed with the in situ threshold-adjusting implantation process for forming the threshold-adjusting layer 103 simultaneously. A doping concentration of the diffusion barrier ions may be in a range of approximately $1E19$ atoms/cm$^3$~$1.5E22$ atoms/cm$^3$.

Since the threshold-adjusting ions may mainly diffuse outwardly through interstitial defects of the threshold-adjusting layer 103, after the diffusion barrier ions, such as Ge, Sn, or C, etc., are doped into the threshold-adjusting layer 103, the interstitial defects of the threshold-adjusting layer 103 may be absorbed by the diffusion barrier ions, and defect clusters may be formed. The scattered interstitial defects in the threshold-adjusting layer 103 may be reduced, thus the threshold-adjusting ions may be prevented from diffusing outwardly to enter into a subsequently formed carrier drifting layer.

Figure 5:
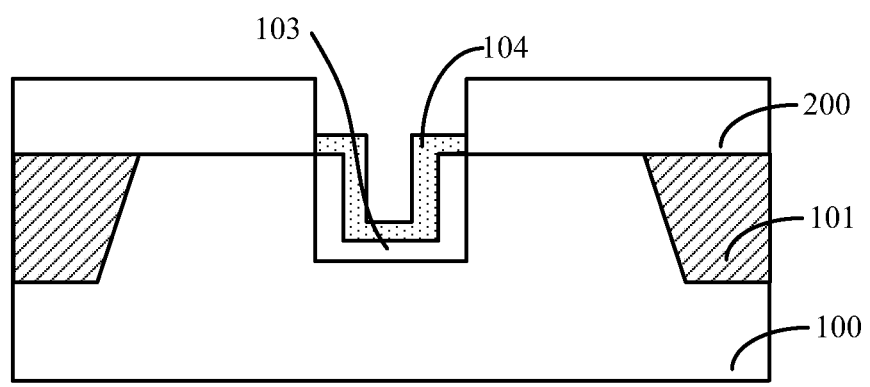

Returning to FIG. 18, after forming the threshold-adjusting layer 103, a barrier layer may be formed (S105). FIG. 5 illustrates a corresponding semiconductor structure.

As shown in FIG. 5, a barrier layer 105 is formed on the surface of the threshold-adjusting layer 103. The barrier layer 105 may be made of any appropriate material, such as Si, Ge, GaAs, InP, or InAs, etc. In one embodiment, the barrier layer 105 is made of silicon. A thickness of the barrier layer 104 may be in a range of approximately 3 nm~15 nm. The barrier layer 105 may be doped with a certain type of diffusion barrier ions, such as Ge ions, Sn ions, and C ions, etc.

Various processes may be used to form the barrier layer 104, such as a CVD process, a PVD process, an ALD process, or an epitaxial growth process, etc. In one embodiment, the barrier layer 104 may be formed by sequentially forming an epitaxial Si layer on the surface of the threshold-adjusting layer 103; and performing an ion implantation process with one of Ge ions, Sn ions and C ions, etc. A power of the ion implantation process may be in a range of approximately 20 KeV~500 KeV. A dose of the ion implantation process may be in a range of approximately 1E15 atoms/cm$^2$~1E16 atoms/cm$^2$. A concentration of the diffusion barrier ions may be in a range of approximately 1E20 atoms/cm$^3$~2.5E22 atoms/cm$^3$.

The surface of the epitaxial layer may become amorphous when the ion implantation process is used to dope Ge ions, Sn ions, or C ions, etc. After a subsequent re-crystallization process using a thermal annealing process, interstitial defects in the barrier layer 104 may be reduced. Thus, a diffusion of P-type ions or N-type ions, such as boron or phosphors, etc., may be prevented.

In certain other embodiments, an in situ doping process may be used to dope the epitaxial layer to form the barrier layer 104.

In certain other embodiments, a certain concentration of threshold-adjusting ions may be doped into the barrier layer 104. A concentration of the threshold-adjusting ions may be in a range of approximately 5E16 atoms/cm$^3$~1E18 atoms/cm$^3$. A type of the threshold-adjusting ions in the barrier layer 104 may be same as a type of the threshold-adjusting ions in the threshold-adjusting layer 103. Further, a concentration of the threshold-adjusting ions in the barrier layer 104 may be smaller than the concentration of the threshold-adjusting ions in the threshold-adjusting layer 103.

Thus, a concentration distribution of the threshold-adjusting ions may gradually reduce from the threshold-adjusting layer 103 to the barrier layer 104, a concentration difference of the threshold-adjusting ions between the threshold-adjusting layer 103 and the barrier layer 104 may be reduced. Further, a diffusion rate of the threshold-adjusting ions from the threshold-adjusting layer 103 to the barrier layer 104 may be reduced as well.

A diffusion of the threshold-adjusting ions, such as boron, or phosphors, etc., in the threshold-adjusting layer 103 may mainly depend on the interstitial defects of silicon crystal. On one hand, Sn ions or Ge ions doped in the barrier layer 104 may form a $Si_xGe_{1-x}$ alloy or a $Si_xSn_{1-x}$ alloy, the $Si_xGe_{1-x}$ alloy or the $Si_xSn_{1-x}$ alloy may reduce the interstitial defects in the barrier layer 104, thus a diffusion from the threshold-adjusting layer 103 to the barrier layer 104 may be prevented. On the other hand, C ions doped in the barrier layer 104 may change the crystal structure of the barrier layer 104, C ions may interact with the interstitial defects in silicon, and defect clusters may be formed. The defect clusters may be significantly difficult to break. Thus, numbers of separated interstitial defects may be reduced, and a diffusion from the threshold-adjusting layer 103 to the barrier layer 104 may be prevented.

In certain other embodiments, the barrier layer 104 may fill up the trench 102, and the barrier layer 104 may be used as a carrier drifting layer. Since the concentration of the threshold-adjusting ions in the barrier layer 104 may be relatively low, the carrier mobility of the barrier layer 104 may be relatively high compared with the threshold-adjusting layer 103. Therefore, during an operation of a transistor, carriers of a channel region in the barrier layer 104 may be increased, a total carrier mobility of the transistor may also be increased.

In one embodiment, the trench 102 may be partially filled by the barrier layer 104, and an intrinsic layer may be subsequently formed on the barrier layer 104.

Figure 6:
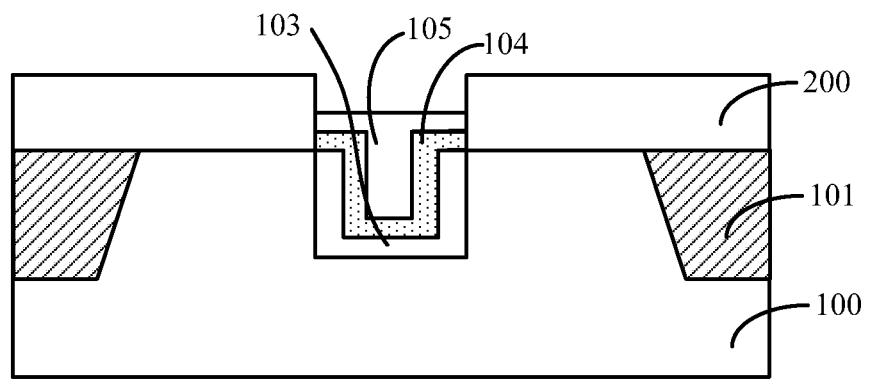

Returning to FIG. 18, after forming the barrier layer 104, an intrinsic layer may be formed on the barrier layer 104 (S106). FIG. 6 illustrates a corresponding semiconductor structure.

As shown in FIG. 6, an intrinsic layer 105 is formed on the barrier layer 104, and the trench 102 may be filled up. The intrinsic layer 105 may be made of any appropriate semiconductor material which is not doped with threshold-adjusting ions, such as silicon, germanium, silicon germanium, or gallium arsenide, etc. The barrier layer 104 and the intrinsic layer 105 may form a carrier drifting layer. A thickness of the intrinsic layer 104 may be in a range of approximately 10 nm~25 nm.

In certain other embodiments, the intrinsic layer 104 may have a certain type of diffusion barrier ions, such as Ge ions, C ions, Sn ions, or a combination thereof. A concentration of the diffusion barrier ions may be in a range of approximately 1E19 atoms/cm$^3$~1E22 atoms/cm$^3$.

Various methods may used to form the intrinsic layer 105, such as a CVD process, a PVD process, an ALD process, or an epitaxial growth process, etc. In one embodiment, a CVD process is used to form the intrinsic layer 105 on the surface of the barrier layer 104. Since the intrinsic layer 105 may not be doped with the threshold-adjusting ions, the carrier mobility of the intrinsic layer 105 may be greater than the carrier mobility of the barrier layer 104 and the threshold-adjusting layer 103. Further, the barrier layer 104 may be able to prevent the threshold-adjusting ions in the threshold-adjusting layer 103 from diffusing into the intrinsic layer 105, thus the carriers in the intrinsic layer 105 may keep a relatively high carrier mobility. Therefore, the carrier mobility of the transistor may be further improved, and the working efficiency of the transistor may be enhanced.

In certain other embodiments, the threshold-adjusting layer 103 may be doped with one or more of Ge ions, Sn ions, or C ions, etc., an ability of the threshold-adjusting ions in the threshold-adjusting layer 103 for diffusing outwardly may be reduced, the intrinsic layer 105 may be directly subsequently formed on the surface of the threshold-adjusting layer 103, and the trench 102 may be filled up. The intrinsic layer 105 may be used as a carrier drifting layer. Since the threshold-adjusting layer 103 may be doped with Ge ions, Sn ions, or C ions, etc., the threshold-adjusting ions in the threshold-adjusting layer 103 may diffuse less into the intrinsic layer 105. Thus, when the intrinsic layer 105 is used as a carrier drifting layer, the intrinsic layer 105 may still have a relatively high carrier mobility, the performance of the transistor may be enhanced.

In one embodiment, the barrier layer 104 may be doped with Ge ions, Sn ions or C ions, etc., a stress may be generated in the intrinsic layer 105. The carrier mobility of the intrinsic layer 105 may be further increased.

Figure 7:
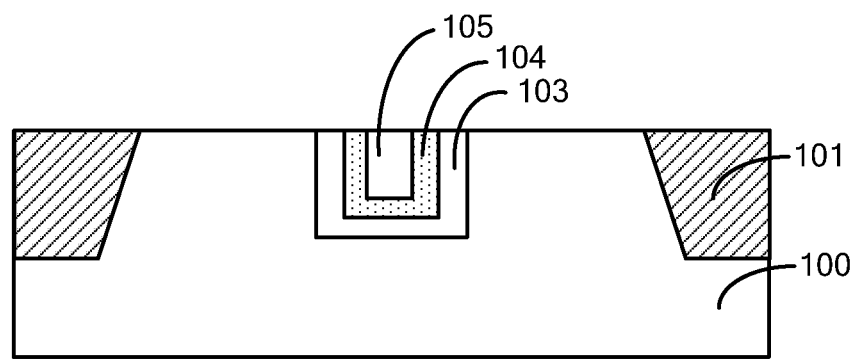

Returning to FIG. 18, after forming the intrinsic layer 105, the mask layer 200 may be removed (S107). FIG. 7 illustrates a corresponding semiconductor structure.

As shown in FIG. 7, the mask layer 200 is removed. The mask layer 200 may be removed by any appropriate process, such as a dry etching process, a wet etching process, or a chemical mechanical polishing (CMP) process, etc. In one embodiment, the mask layer 200 is removed by a CMP process using the surface of the semiconductor substrate 100 as a polishing stop layer. After the CMP process, surfaces of the threshold-adjusting layer 103, the barrier layer 104 and the intrinsic layer 105 may level with the surface of the semiconductor substrate 100.

After the CMP process, the surface of the semiconductor substrate 100 may be planarized, a transistor may be subsequently formed in the semiconductor substrate 100, the threshold-adjusting layer 103, the barrier layer 104 and the intrinsic layer 105 may be under a gate structure of the transistor.

Further, after the CMP process, a plasma treatment process may be performed on the surfaces of the semiconductor substrate 100, the threshold-adjusting layer 103, the barrier layer 104 and the intrinsic layer 105. A plasma source of the plasma treatment process may include one or more of $H_2$, $N_2$, Ar, and $F_2$, etc. In one embodiment, Ar is used as the plasma source of the plasma treatment process. A pressure of the plasma treatment process may be in a range of approximately 20 Pa~50 Pa. Time for the plasma treatment process may be in a range of approximately 150 s~350 s. A flow of Ar may be in a range of approximately 100 sccm~200 sccm. A power density of the plasma treatment process may be in a range of approximately 1 $W/cm^2$~1.5 $W/cm^2$.

Since surface atoms of the intrinsic layer 105, the barrier layer 104, and the threshold-adjusting layer 103 formed by the epitaxial growth process may have unsaturated dangling bonds, the surface atoms may have relatively high surface free energy, and the surface may be rough. After the plasma treatment process, ionized gas may saturate the dangling bonds of the surface atoms, chemical bonds, such as Si—H, Si—N, Si—Ar or Si—F, etc., may be formed. Thus, the extra surface free energy may be released, and the surface atoms may be prone to aligning with a stable low energy status. Surface defects may be reduced, the quality of a subsequently formed gate dielectric layer may be enhanced.

Figure 8:
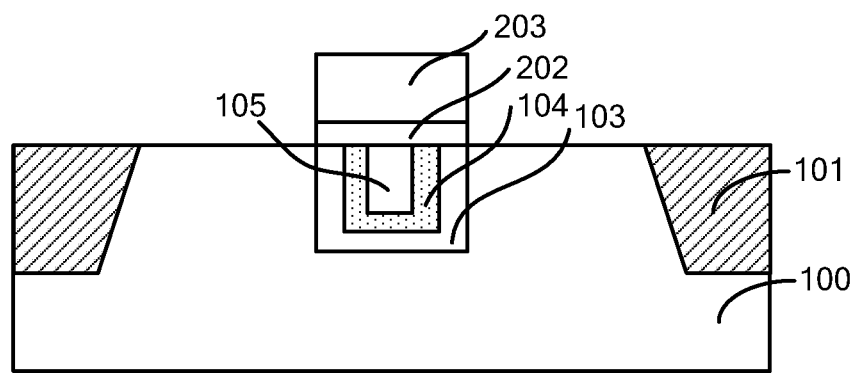

Returning to FIG. 18, after removing the mask layer 200, a gate structure may be formed on the surfaces of the threshold-adjusting layer 103, the barrier layer 104, and the intrinsic layer 105 (S108). FIG. 8 illustrates a corresponding semiconductor structure.

As shown in FIG. 8, a gate structure having a gate dielectric layer 202 and a gate 203 is formed on the surfaces of the threshold-adjusting layer 103, the barrier layer 104, and the intrinsic layer 105. The gate 203 is formed on the surface of the gate dielectric layer 202.

The gate dielectric layer 202 may be made of any appropriate material, such as $SiO_2$, SiON, $HfO_2$, $La_2O_3$, HfSiON, or $HfAlO_3$, etc. Various processes may be used to form the gate dielectric layer 202, such as a CVD process, a PVD process, an ALD process, or a flowable CVD (FCVD) process, etc.

The gate 203 may made of any appropriate material, such as poly silicon, or metal material, etc. Various processes may be used to form the gate 203, such as a CVD process, a PVD process, an ALD process, or an FCVD process, etc.

A width of the gate structure may be greater than the width of the trench 102 (referring to FIG. 2). Thus, the gate structure may completely cover the threshold-adjusting layer 103, the barrier layer 104, and the intrinsic layer 105.

Among of the threshold-adjusting layer 103, the barrier layer 104, and the intrinsic layer 105 under the gate structure, the threshold voltage may be adjusted by adjusting the concentration of the threshold-adjusting ions of the threshold-adjusting layer 103. Further, the barrier layer 104 may prevent the threshold-adjusting ions of the threshold-adjusting layer 103 from diffusing into the intrinsic layer 105, the intrinsic layer 105 may have no, or a small amount of threshold-adjusting ions, thus the intrinsic layer 105 may have less scattering effect on carriers. Therefore, the intrinsic layer 105 may have a relatively high carrier mobility, the carrier mobility of a channel region of the transistor may be increased, the performance of the transistor may be enhanced.

Figure 9:
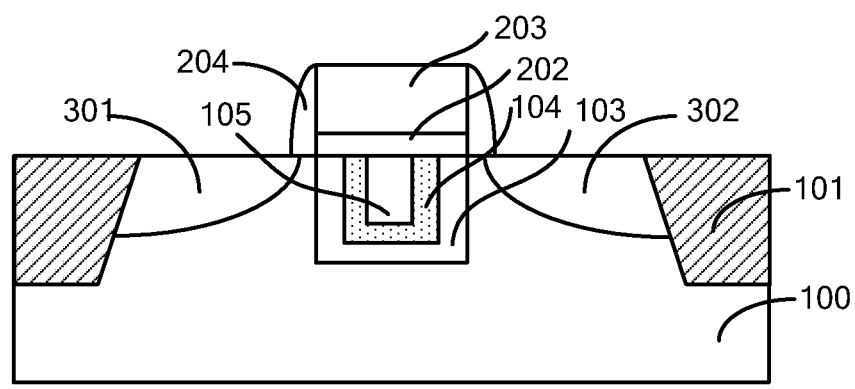

Returning to FIG. 18, after forming the gate structure, a sidewall spacer may be formed on the side surfaces of the gate structure; a source region and a drain region may be formed in the semiconductor substrate 100 at both sides of the sidewall spacer (S109). FIG. 9 illustrates a corresponding semiconductor structure.

As shown in FIG. 9, a sidewall spacer 204 may formed on the side surfaces of the gate structure to surround the gate structure. The sidewall spacer 204 may be made of any appropriate material, such as silicon oxide, silicon nitride, or silicon oxynitride, etc. Various processes may be used to form the sidewall spacer 204, such as a CVD process, a PVD process, an ALD process, or an FCVD process, etc.

Further, a source region 301 and a drain region 302 may be formed in the semiconductor substrate 100 at both sides of the sidewall spacer 204. The source region 301 and the drain region 302 may be formed by an ion implantation process. The source region 301 and the drain region 302 may also be formed by an embedded method.

The source region 301 and the drain region 302 may be doped with N-type ions or P-type ions, since the threshold-adjusting layer 103 and the barrier layer 104 may be on the side surfaces of the trench 102, and may be doped with one or more type of Ge ions, Sn ions or C ions, etc., a lateral diffusion of the P-type ions or the N-type ions to the channel region of the transistor may be prevented, the short channel effect caused by a break-down between the source region 301 and the drain region 302 of the transistor may be improved, the performance of the transistor may be further enhanced.

Thus, a transistor may be formed by the above disclosed processes and methods. A corresponding transistor is shown in FIG. 9. The transistor includes a semiconductor substrate 100 and a threshold-adjusting layer 103. The transistor also includes a barrier layer 104 on the threshold-adjusting layer 103, and an intrinsic layer 105 on the barrier layer 104. Further, the transistor includes a gate structure having a gate dielectric layer 202 and a gate 203, and a sidewall spacer 204 surrounding the gate structure. Further, the transistor also includes a source region 301, a drain region 302, and STI structures 101 in the semiconductor substrate. The detailed structures and intermediate structures are described above with respect to the fabrication processes.

Figure 19:
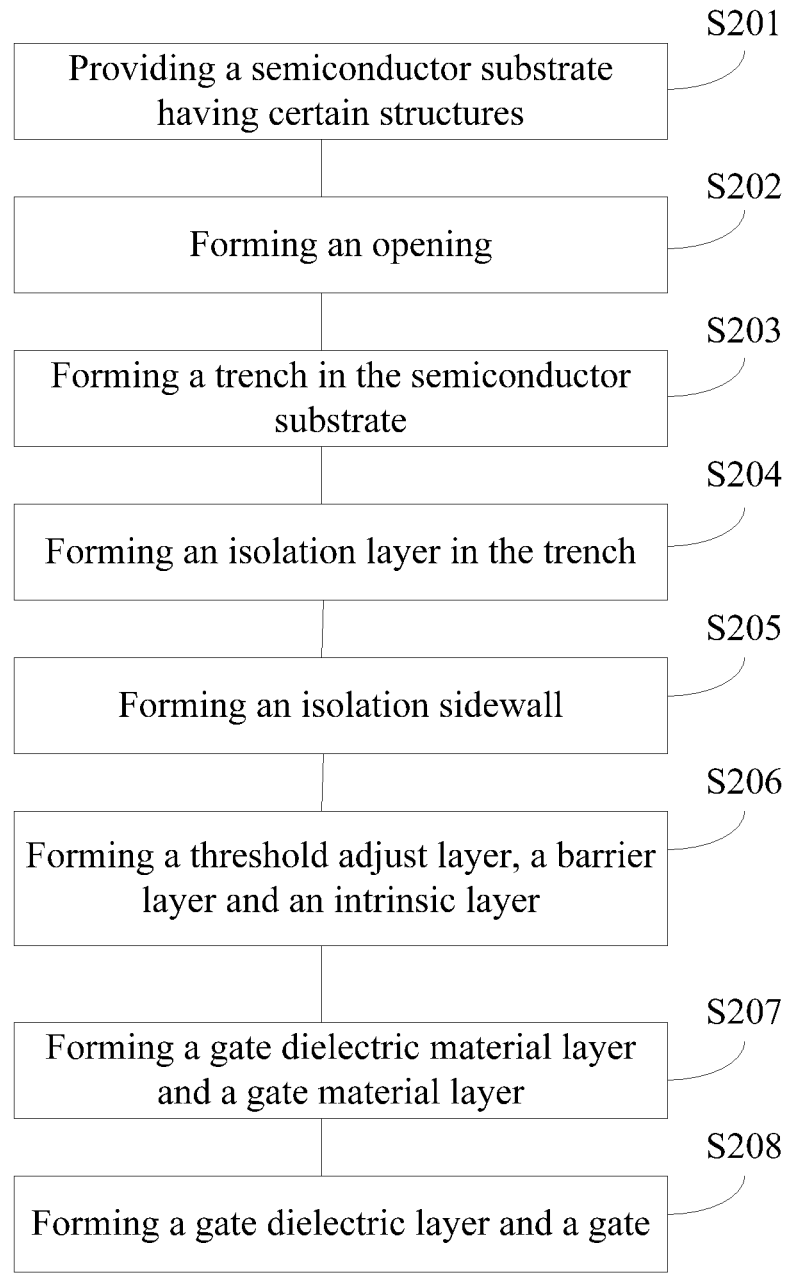
FIG. 19 illustrates another exemplary fabrication process of a semiconductor structure consistent with the disclosed embodiments.

FIG. 19 illustrates another exemplary fabrication process of a transistor, and FIGS. 10-17 illustrate exemplary semiconductor structures corresponding to various stages of the fabrication process.

Figure 10:
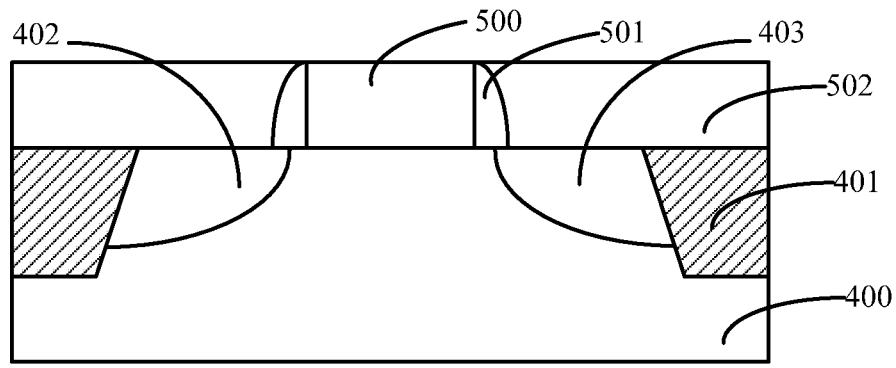
FIGS. 10-17 illustrate semiconductor structures corresponding to certain stages of another exemplary fabrication process of a transistor consistent with the disclosed embodiments.

As shown in FIG. 19, at the beginning of the fabrication process, a semiconductor substrate with certain structures is provided (S201). FIG. 10 illustrates a corresponding semiconductor structure.

As shown in FIG. 10, a semiconductor substrate 400 is provided. A plurality of shallow trench isolation (STI) structures 401 may be formed in the semiconductor substrate 400. A dummy gate structure 500 may be formed on the semiconductor substrate 400, and a sidewall spacer 501 may be formed on the side surface of the dummy gate structure. Further, a source region 402 and a drain region 403 may be formed in the semiconductor substrate 400 at both sides of the sidewall spacer 501. Further, a dielectric layer 502 leveling with the surface of the dummy gate structure 500 may be formed on the surface of the semiconductor substrate 400.

The dielectric layer 502 may be made of any appropriate material, such as silicon nitride, or silicon oxide, etc. Various materials may be used as the dummy gate structure 500. In one embodiment, the dummy gate structure is made of poly silicon. The dummy gate structure 500 may also include dummy gate dielectric layer on the semiconductor substrate 400. The above mentioned structures may be formed by any appropriate gate last process.

Figure 11:
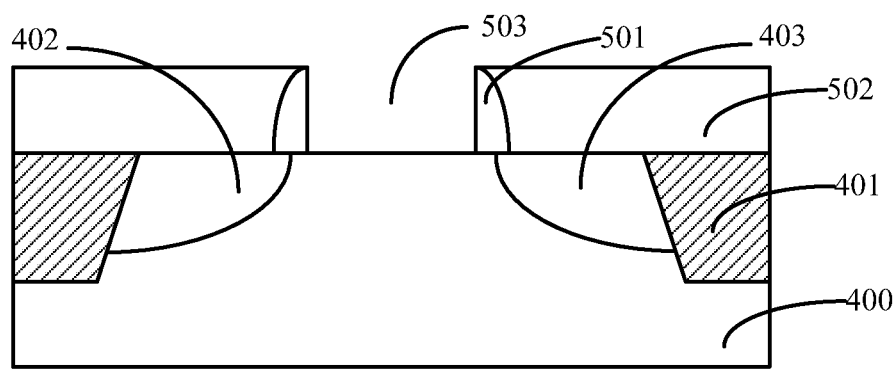

Returning to FIG. 19, after providing the semiconductor substrate 400 with certain structures, an opening may be formed (S202). FIG. 11 illustrates a corresponding semiconductor structure.

As shown in FIG. 11, an opening 503 is formed by removing the dummy gate structure 500. Various processes may be used to remove the dummy gate 500, such as a wet etching process, or a dry etching process, etc.

Figure 12:
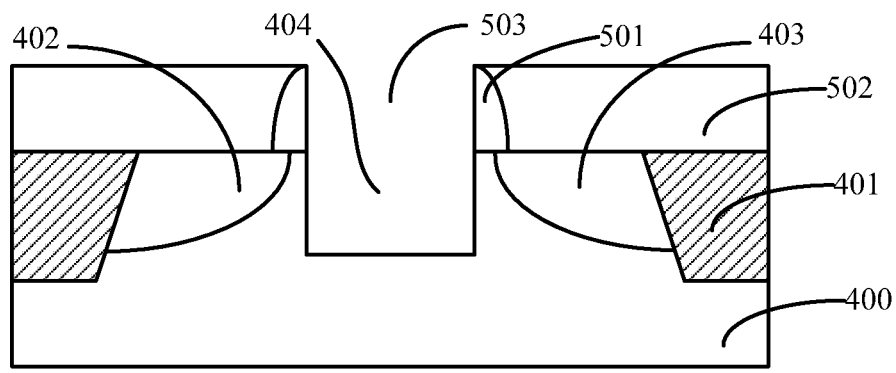

Returning to FIG. 19, after forming the opening 503, a trench may be formed in the semiconductor substrate 400 (S203). FIG. 12 illustrates a corresponding semiconductor structures.

As shown in FIG. 12, a trench 404 is formed in the semiconductor substrate 400. The trench 404 may be formed by etching the semiconductor substrate 400 using the dielectric layer 502 and the sidewall spacer 501 as an etching mask. Various processes may be used to etch the semiconductor substrate 400, such as a dry etching process, or a wet etching process, etc. In one embodiment, a dry etching process is used to etch the semiconductor substrate 400 along the opening 503. Various gases may be used for the dry etching process. In one embodiment, the gases for the dry etching process are $Cl_2$ and HBr. A flow of $Cl_2$ may be in a range of approximately 100 sccm~200 sccm. A flow of HBr may be in range of approximately 50 sccm~300 sccm.

A depth of the trench 404 may be in range of approximately 23 nm~90 nm. The depth of the trench 404 may be equal to a total depth of subsequently formed a threshold-adjusting layer and a carrier drifting layer.

Figure 13:
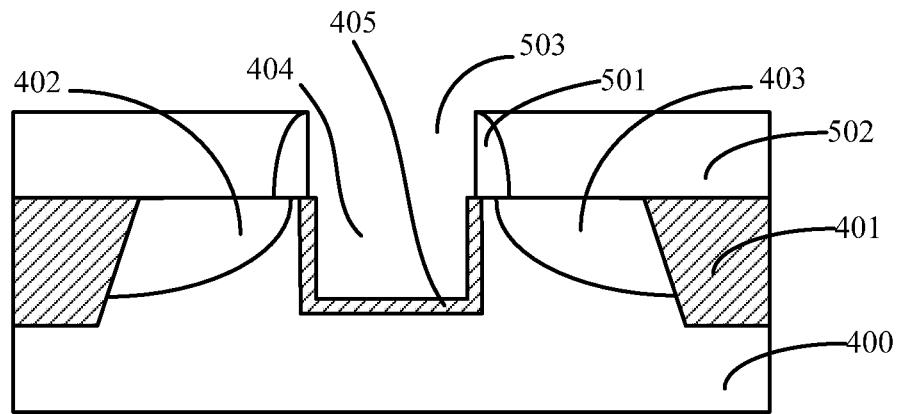

Returning to FIG. 19, after forming the trench 404, an isolation layer may formed in the trench 104 (S204). FIG. 13 illustrates a corresponding semiconductor structure.

As shown in FIG. 13, an isolation layer 405 is formed in the trench 404. The isolation layer 405 may cover the inner surface of the trench 404. The isolation layer 404 may be made of any appropriate material, such as silicon oxide, silicon nitride, or silicon oxynitride, etc. A thickness of the isolation layer 404 may be in a range of approximately 2 nm~10 nm.

Various processes may be used to form the isolation layer 405, such as a CVD process, a PVD process, or a thermal oxidation process, etc. In one embodiment, the isolation layer 405 is made of silicon oxide, a wet or a dry thermal oxidation process is used to form the isolation layer 405.

Since a thermal oxidation process or a nitriding process for forming the isolation layer 405 may consume a portion of silicon of the inner surface of the trench 404, a portion of the isolation layer 405 on the inner surface of the trench 404 may be under the sidewall spacer 501. Thus, a subsequent process for removing the isolation layer 405 may be unable to completely remove the isolation layer 405.

Figure 14:
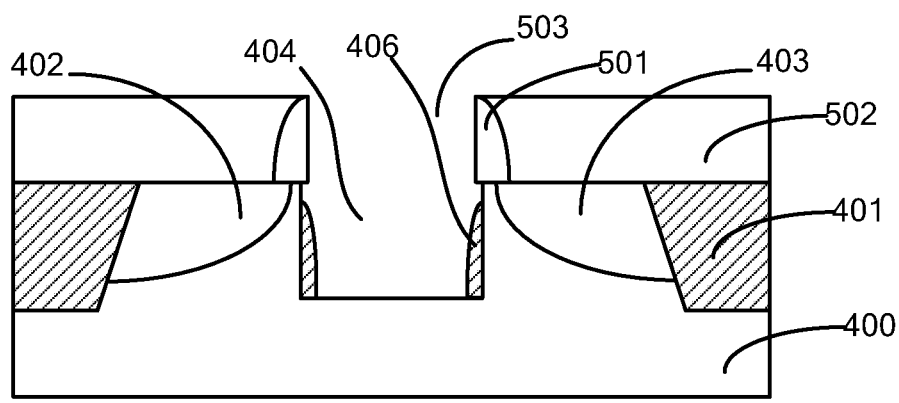

Returning to FIG. 19, after forming the isolation layer 405, an isolation sidewall may be formed (S205). FIG. 14 illustrates a corresponding semiconductor structure.

As show in FIG. 14, an isolation sidewall 406 (may be referred as a buried sidewall) is formed on the sidewall of the trench 404. The isolation sidewall 406 may be formed by etching the isolation layer 405. The top of the isolation sidewall 406 may be lower than the surface of the semiconductor substrate 400. A portion of the sidewall of the trench 404 near to the surface of the semiconductor substrate 400 may be exposed.

Specifically, the isolation sidewall 406 may be formed by etching the isolation layer 405 using the dielectric layer 502 and the sidewall spacer 501 as an etching mask. A portion of the isolation layer 405 on the bottom of the trench 404 may be removed. A height of the isolation layer 405 on the side surface of the trench 404 may be reduced, thus the portion the sidewall of the trench 404 may be exposed. The channel region of a transistor may be subsequently formed in the trench 404, the isolation sidewall 406 may prevent doping ions of the source region 402 and the drain region 403 from diffusing into the channel region, thus the short channel effect of the transistor may be improved.

Further, the isolation sidewall 406 may expose a portion of the sidewall of the trench 404, which may cause the source region 402 and the drain region 403 to connect with a subsequently formed channel region. The surface of the semiconductor substrate 400 may be higher than the top of the isolation sidewall 406 in a range of approximately 5 nm~20 nm. Since a height of a uncovered sidewall (may be referred as a channel widow) of the trench 404 may be relatively small, a diffusion efficiency of the doping ions in the source region 402 and the drain region 403 for diffusing into the channel region may be significantly low, thus the carrier mobility of the channel region may be relatively high.

In certain other embodiments, it may be unnecessary to form the isolation layer 405 and the isolation sidewall 406.

Figure 15:
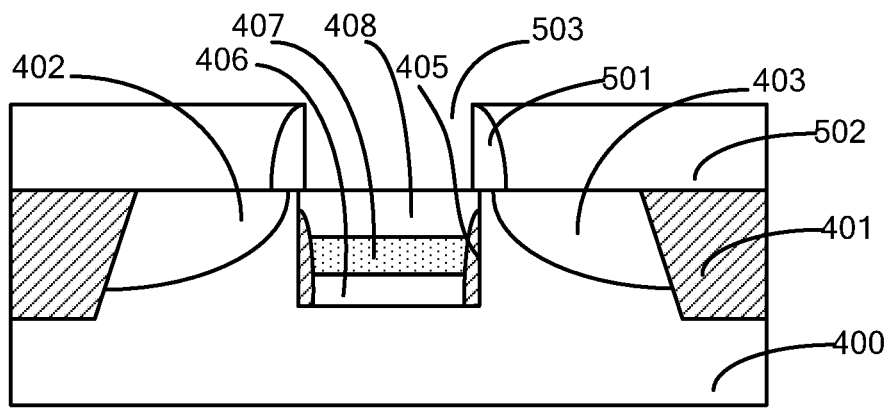

Returning to FIG. 19, after forming the isolation sidewall 406, a threshold-adjusting layer, a barrier layer and an intrinsic layer may sequentially formed in the trench 404 (S206). FIG. 15 illustrates a corresponding semiconductor structure.

As shown in FIG. 15, a threshold-adjusting layer 406 is formed on the surface of the semiconductor substrate 400 in the trench 404. The threshold-adjusting layer 406 may be made of any appropriate material. In one embodiment, the threshold-adjusting layer 406 is silicon doped with certain appropriate threshold-adjusting ions. A concentration of the threshold-adjusting ions may be in a range of approximately 5E17 atom/$cm^3$~1E19 atoms/$cm^3$ Various processes may be used to form the threshold-adjusting layer 406, such as a CVD process, a PVD process, an ALD process, or an epitaxial growth process, etc. In one embodiment, the threshold-adjusting layer 406 is formed by an epitaxial growth process. Since the side surface of the trench 404 may have an isolation layer 405, the threshold-adjusting layer 406 formed by the epitaxial growth process may only grow on the bottom surface of the trench 404 (or the surface of the semiconductor substrate 400 in the trench 404).

In certain other embodiments, the threshold-adjusting layer 406 may have one or more types of diffusion barrier ions including Ge ions, Sn ions and C ions, etc. A concentration of the diffusion barrier ions may be in a range of approximately 1E19 atoms/$cm^3$~1.5E22 atoms/$cm^3$.

Further, as shown in FIG. 15, after forming the threshold-adjusting layer 406, a barrier layer 407 is formed on the threshold-adjusting layer 406. The barrier layer 407 may be made of any appropriate material. In one embodiment, the barrier layer 407 is made of silicon doped with one or more of diffusion barrier ions including Ge ions, Sn ions, and C ions, etc. A concentration of the diffusion barrier ion may be in a range of approximately 1E20 atoms/$cm^3$~2.5E22 atoms/$cm^3$.

In certain other embodiments, the barrier layer 407 may also be doped with a certain type of threshold-adjusting ions with a low concentration. The concentration of the threshold-adjusting ions may be in a range of approximately 5E16 atom/$cm^3$~1E18 atoms/$cm^3$. By doping with the low concentration threshold-adjusting ions, a concentration difference of the threshold-adjusting ions between the threshold-adjusting layer 406 and the barrier layer 407 may be reduced, a diffusion rate of the threshold-adjusting ions from the threshold-adjusting layer 406 to the barrier layer 407 may be reduced.

Various processes may be used to form the barrier layer 407, such as a CVD process, a PVD process, or an epitaxial process, etc. In one embodiment, the barrier layer 407 is formed by an epitaxial growth process. The barrier layer 407 may be doped by any appropriate process, such as an in situ doping process, or an ion implantation process, etc.

Further, as shown in FIG. 15, an intrinsic layer 408 is formed on the barrier layer 407. The intrinsic layer 408 may be made of any appropriate material, such as silicon, germanium, silicon germanium, or gallium arsenide, etc. No threshold-adjusting ions may be doped into the intrinsic layer 408. A thickness of the intrinsic layer 408 may be in a range of approximately 10 nm~25 nm.

In certain other embodiments, the intrinsic layer 408 may have a certain type of diffusion barrier ions. The diffusion barrier ions may be one or more of Ge ions, Sn ions, or C ions, etc. A concentration of the diffusion barrier ions in the intrinsic layer 408 may be in a range of approximately 1E19 atoms/$cm^3$~1E22 atoms/$cm^3$.

Since the barrier layer 407 may be doped with one or more of Ge ions, Sn ions, C ions, interstitial defects of the barrier layer 407 may be reduced, a diffusion of the threshold-adjusting ions in the threshold-adjusting layer 406 may be prevented. Carriers may enter into the intrinsic layer 407 from the source region 402 through the uncovered sidewall (exposed by the isolation sidewall 405) of the trench 404, and then may enter into the drain region 403 through the other uncovered sidewall of the trench 404. Since the concentration of the threshold-adjusting ions in the intrinsic layer 408 may be substantially low, or may be zero, the intrinsic layer 408 may have a relatively high carrier mobility, and the carriers may mainly accumulate in the intrinsic layer 408. Further, the concentration of the threshold-adjusting ions in the barrier layer 407 may be lower than the concentration of the threshold-adjusting ions in the threshold-adjusting layer 407, and a relatively high carrier mobility may still be obtained even if the carriers may enter into the barrier layer 407. The barrier layer 407 and the intrinsic layer 408 may be used as a carrier drifting layer, the carrier mobility of a transistor may be increased, and the short channel effect of the transistor may be improved.

In certain other embodiments, it may only need to form one of the barrier layer 407 and the intrinsic layer 408 on the surface of the threshold-adjusting layer 406 to be used as the carrier drifting layer.

After forming the intrinsic layer 408, a plasma treatment process may be performed on the surface of the intrinsic layer 408. A gas source of the plasma treatment process may be one or more of $H_2$, $N_2$, Ar, or $F_2$, etc. In one embodiment, the gas source of the plasma treatment process is Ar.

Since silicon atoms on the surface of the intrinsic layer 408 may have dangling bonds, and the dangling bonds may have relatively high free energy, which may cause the intrinsic layer 408 to have a rough surface. By using the plasma treatment process, ionized gas of the plasma treatment process may saturate the dangling bonds of the surface of the intrinsic layer 408, chemical bonds including Si—H, Si—N, Si—Ar or Si—F may be formed. Extra surface free energies may be released, thus an arrangement of the surface atoms may be prone to a stable low energy status, and defects on the surface of the intrinsic layer 408 may reduced. Therefore, a smoother surface of the intrinsic layer 408 may be obtained, and the quality of a subsequently formed gate dielectric layer on the intrinsic layer 408 may be improved.

Figure 16:
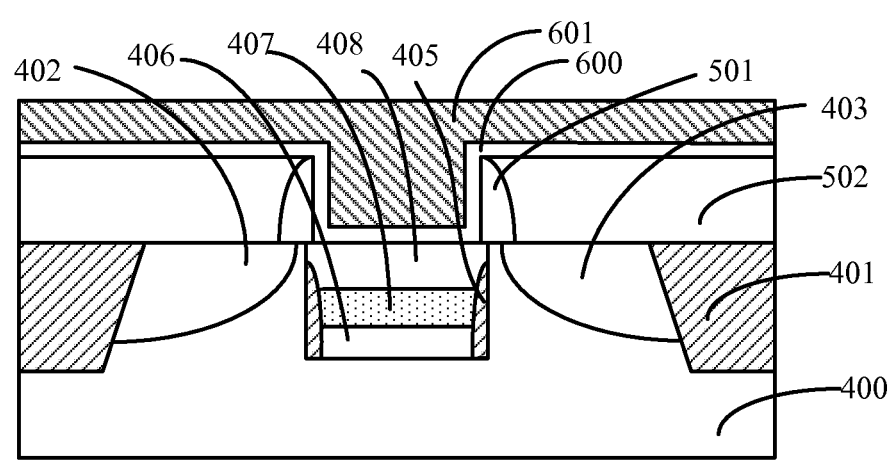

Returning to FIG. 16, after performing the plasma treatment process, a gate dielectric material layer may be formed on the intrinsic layer 408 (S207). FIG. 16 illustrates a corresponding semiconductor structure.

As show in FIG. 16, a gate dielectric material layer 600 is formed on the intrinsic layer 408. The gate dielectric material layer 600 may cover the sidewalls of the opening 503 and the surface of the dielectric layer 502. The dielectric gate material layer 600 may be made of any appropriate material, such as $SiO_2$, SiON, $HfO_2$, $La_2O_3$, HfSiON, or $HfAlO_2$, etc. Various processes may be used to form the gate dielectric material layer 600, such as a CVD process, a PVD process, an ALD process, or an FCVD process, etc.

Further, as shown in FIG. 16, a gate material layer 601 may be formed on the gate dielectric material layer 600. The gate material layer 601 may fill up the opening 503. The gate material layer 601 may be made of poly silicon, or any other appropriate metal material. Various processes may be used to form the gate material layer 601, such as a CVD process, a PVD process, an ALD process, or an FCVD process, etc.

Figure 17:
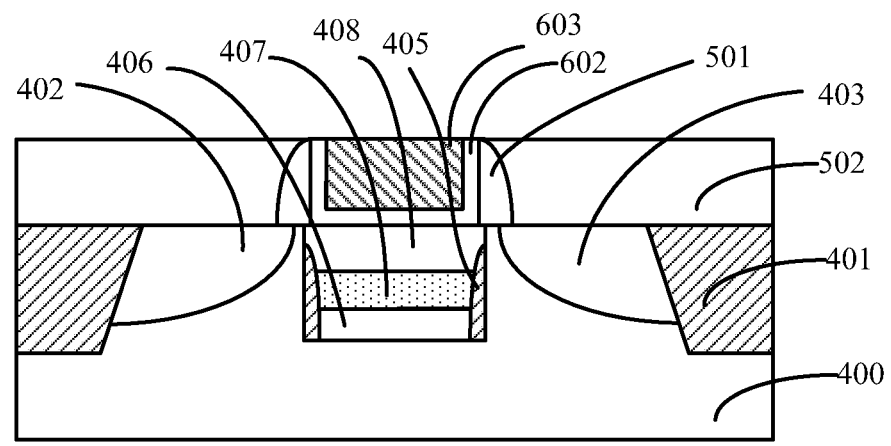

Returning to FIG. 19, after forming the gate dielectric material layer 600 and the gate material layer 601, a gate dielectric layer and a gate may be formed (S208). FIG. 17 illustrates a corresponding semiconductor structure.

As shown in FIG. 17, a gate dielectric layer 602 and a gate 603 are formed. The gate dielectric layer 602 and the gate 603 may be formed by removing portions of the gate dielectric material layer 600 and the gate material layer 601 on the surface of the dielectric layer 502. Various processes may be used to remove the portions of the gate dielectric material layer 600 and the gate material layer 601 on the surface of the dielectric layer 502, such a chemical mechanical polishing process (CMP), or an etching process, etc. In one embodiment, the portions of the gate dielectric material layer 600 and the gate material layer 601 on the surface of the dielectric layer 502 are removed by a CMP process, and the dielectric layer 502 may be used as a polishing stop layer.

Among of the intrinsic layer 408, the barrier layer 407 and the threshold-adjusting layer 406 under the gate dielectric layer 602, the threshold voltage of the transistor may be adjusted by adjusting the concentration of the threshold-adjusting ions in the threshold-adjusting layer 406. The barrier layer 407 may prevent the threshold-adjusting ions in the threshold-adjusting layer 406 from diffusing into the intrinsic layer 408, thus it may have no, or a substantially small amount of threshold-adjusting ions in the intrinsic layer 408. The carriers of a channel region of the transistor may main drift in the intrinsic layer 408, the intrinsic layer may have a substantially weak scattering effect on the carriers, thus the channel region may have a relatively high carrier mobility, and the carrier mobility of the transistor may be improved.

Further, the barrier layer 407 may be doped with one or more of Ge ions, Sn ions, and C ions, etc., a stress effect may be generated in the intrinsic layer 408, thus the carrier mobility of the intrinsic layer 408 may be increased, and the carrier mobility of the transistor may be further enhanced.

If the transistor is an NMOS transistor, electrons may be the carriers of the transistor. A SiC crystal may be formed in the barrier layer 407 if the barrier layer 407 is doped with C, a compression stress may be formed in the barrier layer 407. Since the intrinsic layer 408 may be formed on the surface of the barrier layer 407, the intrinsic layer 408 may be affected by the compression stress in the barrier layer 407, the carrier mobility of the intrinsic layer 408 and the barrier layer 407 may be increased, the performance of the transistor may be further enhanced.

If the transistor is a PMOS transistor, holes may be the carriers of the transistor. A SiGe crystal may be formed in the barrier layer 407 if the barrier layer 407 is doped with Ge, a tensile stress may be formed in the barrier layer 407. Since the intrinsic layer 408 may be formed on the surface of the barrier layer 407, the intrinsic layer 408 may be affected by the tensile stress in the barrier layer 407, the carrier mobility of the intrinsic layer 408 and the barrier layer 407 may be increased, the performance of the transistor may be further enhanced.

Thus, a transistor may be formed by the above disclosed processes and methods, a corresponding semiconductor structure is shown in FIG. 17. The transistor includes a semiconductor substrate 400, a plurality of STI structures 401, a source region 402 and a drain region 403 in the semiconductor substrate 400. The transistor also includes an isolation sidewall 405, a threshold-adjusting layer 406, a barrier layer 407 and an intrinsic layer 408 in the semiconductor substrate 400. Further, the transistor includes a gate dielectric layer 602 and a gate 603 on the semiconductor substrate 400. Further, the transistor also includes a sidewall spacer 501 surrounding the gate dielectric layer 602 and the gate 603, and a dielectric layer 502 on the semiconductor substrate 400. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
providing a semiconductor substrate;
forming a trench in the semiconductor substrate by etching the semiconductor substrate;
forming a threshold-adjusting layer on the semiconductor substrate in the trench;
forming a carrier drifting layer on the threshold-adjusting layer;
performing a plasma treatment process on the carrier drifting layer; and
forming a gate structure on the carrier drifting layer corresponding to the trench, wherein:
the threshold-adjusting layer is a semiconductor layer doped with a certain type of threshold-adjusting ions to adjust the threshold voltage of the transistor.

2. The method according to claim 1, wherein:
the gate structure includes a gate dielectric layer and a gate layer.

3. The method according to claim 1, after forming the gate structure, further including:
forming a sidewall spacer surrounding the gate structure; and
forming a source region and a drain region in the semiconductor substrate at both sides of the sidewall spacer.

4. The method according to claim 1, wherein:
the threshold-adjusting layer is doped with threshold-adjusting ions; and
a concentration of the threshold-adjusting ions is in a range of approximately 5E17 atoms/cm$^3$-1E19 atoms/cm$^3$.

5. The method according to claim 1, wherein:
the semiconductor substrate is silicon, or silicon on insulator (SOI).

6. The method according to claim 1, wherein:
a gas source of the plasma treatment process is one or more of $N_2$, Ar, $F_2$, and $H_2$.

7. The method according claim 1, wherein:
the carrier drifting layer includes one or more of a barrier layer and an intrinsic layer.

8. The method according to claim 7, wherein:
a thickness of the barrier layer is in a range of approximately 3 nm-15 nm; and
a thickness of the intrinsic layer is in a range of approximately 10 nm-25 nm.

9. The method according to claim 7, wherein:
the barrier layer is doped with one or more diffusion barrier ions including Ge ions, Sn ions, and C ions; and
a concentration of the diffusion barrier ions is in a range of approximately 1E20 atoms/cm$^3$-2.5E22 atoms/cm$^3$.

10. The method according to claim 7, wherein:
the intrinsic layer is doped with diffusion barrier ions including one or more of Ge ions, Sn ions, and C ions; and
a concentration of the diffusion barrier ions is in a range of approximately 1E19 atoms/cm$^3$-E22 atoms/cm$^3$.

11. A method for fabricating a transistor, comprising:
providing a semiconductor substrate;
forming a trench in the semiconductor substrate by etching the semiconductor substrate;
forming a threshold-adjusting layer on the semiconductor substrate in the trench;
forming a carrier drifting layer on the threshold-adjusting layer; and
forming a gate structure on the carrier drifting layer corresponding to the trench, wherein:
the threshold-adjusting layer is a semiconductor layer doped with a certain type of threshold-adjusting ions to adjust the threshold voltage of the transistor,
the threshold-adjusting layer is doped with diffusion barrier ions; and
a concentration of the diffusion barrier ions is in a range of approximately 1E19 atoms/cm$^3$-1.5E22 atoms/cm$^3$.

12. The method according to claim 11, wherein:
the gate structure includes a gate dielectric layer and a gate layer.

13. The method according to claim 11, after forming the gate structure, further including:
forming a sidewall spacer surrounding the gate structure; and
forming a source region and a drain region in the semiconductor substrate at both sides of the sidewall spacer.

14. The method according to claim 11, wherein:
the threshold-adjusting layer is doped with threshold-adjusting ions; and
a concentration of the threshold-adjusting ions is in a range of approximately 5E17 atoms/cm$^3$-1E19 atoms/cm$^3$.

15. The method according to claim 11, wherein:
the semiconductor substrate is silicon, or silicon on insulator (SOI).

16. The method according claim 11, wherein:
the carrier drifting layer includes one or more of a barrier layer and an intrinsic layer.

17. The method according to claim 16, wherein:
a thickness of the barrier layer is in a range of approximately 3 nm-15 nm; and
a thickness of the intrinsic layer is in a range of approximately 10 nm-25 nm.

18. The method according to claim 16, wherein:
the barrier layer is doped with one or more diffusion barrier ions including Ge ions, Sn ions, and C ions; and
a concentration of the diffusion barrier ions is in a range of approximately 1E20 atoms/cm$^3$-2.5E22 atoms/cm$^3$.

19. The method according to claim 16, wherein:
the intrinsic layer is doped with diffusion barrier ions including one or more of Ge ions, Sn ions, and C ions; and
a concentration of the diffusion barrier ions is in a range of approximately 1E19 atoms/cm$^3$-1E22 atoms/cm$^3$.

\* \* \* \* \*